US012334873B2

(12) United States Patent
Drogi et al.

(10) Patent No.: US 12,334,873 B2
(45) Date of Patent: *Jun. 17, 2025

(54) MULTI-LEVEL ENVELOPE TRACKING SYSTEMS WITH SEPARATE DC AND AC PATHS

(71) Applicant: Skyworks Solutions, Inc., Irvine, CA (US)

(72) Inventors: Serge Francois Drogi, Flagstaff, AZ (US); Florinel G. Balteanu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/646,024

(22) Filed: Apr. 25, 2024

(65) Prior Publication Data

US 2024/0275334 A1    Aug. 15, 2024

Related U.S. Application Data

(63) Continuation of application No. 17/456,950, filed on Nov. 30, 2021, now Pat. No. 11,996,806, which is a
(Continued)

(51) Int. Cl.
*H03F 1/30* (2006.01)
*H03F 1/02* (2006.01)
(Continued)

(52) U.S. Cl.
CPC ........... *H03F 1/0227* (2013.01); *H03F 3/195* (2013.01); *H03F 3/245* (2013.01);
(Continued)

(58) Field of Classification Search
CPC .................................... H03F 1/30; H03F 3/20
(Continued)

(56) References Cited

U.S. PATENT DOCUMENTS

| 6,438,365 B1 | 8/2002 | Balteanu |
| 6,704,560 B1 | 3/2004 | Balteanu et al. |

(Continued)

FOREIGN PATENT DOCUMENTS

| JP | 2010-016794 | 1/2010 |
| JP | 2012-004882 | 1/2012 |

(Continued)

OTHER PUBLICATIONS

International Search Report and Written Opinion for International Application No. PCT/US2020/052329 dated Jan. 8, 2021 in 10 pages.
(Continued)

*Primary Examiner* — Henry Choe
(74) *Attorney, Agent, or Firm* — Knobbe, Martens, Olson & Bear, LLP

(57) ABSTRACT

Multi-level envelope tracking systems are disclosed. In certain embodiments, a method of envelope tracking includes amplifying a radio frequency signal using a power amplifier, supplying power to the power amplifier using a power amplifier supply voltage, generating a plurality of delay-controlled regulated voltages based on controlling a delay of a plurality of regulated voltages using a controllable delay circuit, generating a modulator output voltage at a modulator output of a modulator, providing filtering using a first filter coupled between the modulator output and the power amplifier supply voltage, and controlling activation of a plurality of switches of the modulator based on an envelope of the radio frequency signal. The plurality of switches are each coupled between the modulator output and a corresponding one of the plurality of delay-controlled regulated voltages.

20 Claims, 14 Drawing Sheets

Related U.S. Application Data continuation of application No. 16/948,542, filed on Sep. 23, 2020, now Pat. No. 11,223,323.

(60) Provisional application No. 62/907,120, filed on Sep. 27, 2019.

(51) Int. Cl.
  *H03F 3/195* (2006.01)
  *H03F 3/24* (2006.01)

(52) U.S. Cl.
  CPC .. *H03F 2200/102* (2013.01); *H03F 2200/168* (2013.01); *H03F 2200/336* (2013.01); *H03F 2200/451* (2013.01)

(58) Field of Classification Search
  USPC ....................................... 330/297, 129, 136
  See application file for complete search history.

(56) References Cited

U.S. PATENT DOCUMENTS

| | | | |
|---|---|---|---|
| 6,977,976 | B1 | 12/2005 | Birkett et al. |
| 7,496,339 | B2 | 2/2009 | Balteanu et al. |
| 8,140,028 | B2 | 3/2012 | Balteanu et al. |
| 8,351,873 | B2 | 1/2013 | Balteanu et al. |
| 8,718,188 | B2 | 5/2014 | Balteanu et al. |
| 8,786,371 | B2 | 7/2014 | Popplewell et al. |
| 8,866,548 | B2 | 10/2014 | Drogi et al. |
| 8,981,847 | B2 | 3/2015 | Balteanu |
| 9,002,312 | B1 | 4/2015 | Wyse |
| 9,083,455 | B2 | 7/2015 | Popplewell et al. |
| 9,092,393 | B2 | 7/2015 | Whitefield et al. |
| 9,118,277 | B2 | 8/2015 | Balteanu et al. |
| 9,143,096 | B2 | 9/2015 | Balteanu et al. |
| 9,189,430 | B2 | 11/2015 | Ross et al. |
| 9,197,128 | B2 | 11/2015 | Popplewell et al. |
| 9,225,308 | B2 * | 12/2015 | Langer ................. H03F 3/245 |
| 9,288,098 | B2 * | 3/2016 | Yan ..................... H04B 1/0475 |
| 9,294,054 | B2 | 3/2016 | Balteanu et al. |
| 9,391,648 | B2 | 7/2016 | Popplewell et al. |
| 9,425,833 | B2 | 8/2016 | Popplewell et al. |
| 9,445,371 | B2 | 9/2016 | Khesbak et al. |
| 9,584,070 | B2 | 2/2017 | Balteanu et al. |
| 9,588,529 | B2 | 3/2017 | Balteanu et al. |
| 9,606,947 | B2 | 3/2017 | Ross et al. |
| 9,668,215 | B2 | 5/2017 | Balteanu et al. |
| 9,673,707 | B2 | 6/2017 | Popplewell et al. |
| 9,698,832 | B2 | 7/2017 | Popplewell et al. |
| 9,774,300 | B2 | 9/2017 | Jin et al. |
| 9,806,676 | B2 | 10/2017 | Balteanu et al. |
| 9,831,834 | B2 | 11/2017 | Balteanu et al. |
| 9,876,473 | B2 | 1/2018 | Khesbak et al. |
| 9,893,682 | B2 | 2/2018 | Zhu et al. |
| 9,935,582 | B2 | 4/2018 | Balteanu et al. |
| 9,948,241 | B2 | 4/2018 | Popplewell et al. |
| 9,971,377 | B2 | 5/2018 | Balteanu et al. |
| 9,973,088 | B2 | 5/2018 | Balteanu et al. |
| 9,990,322 | B2 | 6/2018 | Whitefield et al. |
| 9,991,856 | B2 | 6/2018 | Khesbak et al. |
| 11,223,323 | B2 | 1/2022 | Drogi et al. |
| 11,996,806 | B2 | 5/2024 | Drogi et al. |
| 12,126,307 | B2 * | 10/2024 | Balteanu ............... H03F 1/0238 |
| 2003/0146791 | A1 | 8/2003 | Shvarts et al. |
| 2011/0058601 | A1 | 3/2011 | Kim et al. |
| 2012/0269240 | A1 | 10/2012 | Balteanu et al. |
| 2012/0293254 | A1 | 11/2012 | Liu et al. |
| 2013/0207731 | A1 | 8/2013 | Balteanu |
| 2014/0184337 | A1 | 7/2014 | Nobbe et al. |
| 2015/0054588 | A1 | 2/2015 | Wimpenny |
| 2015/0236729 | A1 * | 8/2015 | Peng .................. H03F 1/56 455/114.3 |
| 2016/0028305 | A1 | 1/2016 | Kay et al. |
| 2016/0036388 | A1 | 2/2016 | Xu et al. |
| 2017/0005619 | A1 | 1/2017 | Khlat |
| 2017/0131734 | A1 | 5/2017 | Balteanu et al. |
| 2017/0179887 | A1 | 6/2017 | Henzler et al. |
| 2017/0195972 | A1 | 7/2017 | Drogi et al. |
| 2017/0223632 | A1 | 8/2017 | Balteanu et al. |
| 2017/0228332 | A1 | 8/2017 | Ross et al. |
| 2017/0338773 | A1 | 11/2017 | Balteanu et al. |
| 2018/0076772 | A1 | 3/2018 | Khesbak et al. |
| 2018/0138862 | A1 | 5/2018 | Balteanu et al. |
| 2018/0152945 | A1 | 5/2018 | Balteanu |
| 2018/0159476 | A1 | 6/2018 | Balteanu et al. |
| 2018/0159478 | A1 | 6/2018 | Balteanu et al. |
| 2018/0167037 | A1 | 6/2018 | Zhu et al. |
| 2018/0234095 | A1 | 8/2018 | Balteanu et al. |
| 2018/0278214 | A1 | 9/2018 | Jin et al. |
| 2018/0287573 | A1 | 10/2018 | Khesbak et al. |
| 2018/0294776 | A1 | 10/2018 | Popplewell et al. |
| 2018/0302036 | A1 | 10/2018 | Balteanu et al. |
| 2018/0331659 | A1 | 11/2018 | Khesbak et al. |
| 2018/0351454 | A1 | 12/2018 | Khesbak et al. |
| 2018/0375476 | A1 | 12/2018 | Balteanu et al. |
| 2018/0375483 | A1 | 12/2018 | Balteanu et al. |
| 2019/0020315 | A1 | 1/2019 | Khesbak et al. |
| 2019/0068122 | A1 | 2/2019 | Ha et al. |
| 2019/0123690 | A1 | 4/2019 | Balteanu et al. |
| 2019/0158046 | A1 | 5/2019 | Lehtola et al. |
| 2019/0165736 | A1 | 5/2019 | Khesbak et al. |
| 2019/0190462 | A1 | 6/2019 | Zhu et al. |
| 2019/0229621 | A1 | 7/2019 | Balteanu et al. |
| 2019/0341888 | A1 | 11/2019 | Drogi et al. |
| 2019/0372526 | A1 | 12/2019 | Balteanu et al. |
| 2019/0372628 | A1 | 12/2019 | Balteanu et al. |
| 2019/0386617 | A1 | 12/2019 | Naraine et al. |
| 2020/0067406 | A1 | 2/2020 | Khesbak et al. |
| 2020/0099343 | A1 | 3/2020 | Khesbak et al. |
| 2020/0112300 | A1 | 4/2020 | Balteanu et al. |
| 2020/0127619 | A1 | 4/2020 | Khesbak et al. |
| 2020/0154434 | A1 | 5/2020 | Balteanu |
| 2020/0162028 | A1 | 5/2020 | Balteanu et al. |
| 2020/0162030 | A1 | 5/2020 | Drogi et al. |
| 2020/0259458 | A1 | 8/2020 | Balteanu et al. |
| 2020/0259459 | A1 | 8/2020 | Balteanu et al. |
| 2020/0336110 | A1 | 10/2020 | Drogi et al. |
| 2020/0336122 | A1 | 10/2020 | Lin et al. |
| 2020/0343865 | A1 | 10/2020 | Balteanu et al. |

FOREIGN PATENT DOCUMENTS

| | | |
|---|---|---|
| JP | 2013-005209 | 1/2013 |
| JP | 2013-511242 | 3/2013 |
| JP | 2015-533066 | 11/2015 |
| JP | 2016-149743 | 8/2016 |
| JP | 2022-549331 | 11/2022 |
| KR | 10-2015-0040088 | 4/2015 |
| WO | WO 2012/176578 | 12/2012 |
| WO | WO 2021/061864 | 4/2021 |

OTHER PUBLICATIONS

International Preliminary Report on Patentability and Written Opinion for International Application No. PCT/US2020/052329 dated Mar. 15, 2022 in 7 pages.

* cited by examiner

MULTI-LEVEL ENVELOPE TRACKING SYSTEMS WITH SEPARATE DC AND AC PATHS

CROSS-REFERENCE TO RELATED APPLICATIONS

This application is a continuation of U.S. application Ser. No. 17/456,950, filed Nov. 30, 2021, and titled "MULTI-LEVEL ENVELOPE TRACKING SYSTEMS WITH SEPARATE DC AND AC PATHS," which is a continuation of U.S. application Ser. No. 16/948,542, filed Sep. 23, 2020, and titled "MULTI-LEVEL ENVELOPE TRACKING SYSTEMS WITH SEPARATE DC AND AC PATHS," which claims the benefit of priority under 35 U.S.C. § 119 of U.S. Provisional Patent Application No. 62/907,120, filed Sep. 27, 2019 and titled "MULTI-LEVEL ENVELOPE TRACKING SYSTEMS WITH SEPARATE DC AND AC PATHS," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications in frequency range 1 (FR1).

SUMMARY

In certain embodiments, the present disclosure relates to an envelope tracking system including a power amplifier configured to amplify a radio frequency signal and to receive power from a power amplifier supply voltage, and an envelope tracker configured to generate the power amplifier supply voltage based on an envelope signal corresponding to an envelope of the radio frequency signal. The envelope tracker includes a DC-to-DC converter configured to output a plurality of regulated voltages, a modulator configured to generate a modulator output voltage based on the plurality of regulated voltages and the envelope signal, a first filter coupled between the modulator output voltage and the power amplifier supply voltage, and a second filter coupled between a DC voltage and the power amplifier supply voltage.

In various embodiments, the DC-to-DC converter is further configured to generate the DC voltage. According to a number of embodiments, the DC-to-DC converter is configured to generate the DC voltage with a different pulse-width modulator sequence relative to each of the plurality of regulated voltages.

In several embodiments, the DC-to-DC converter is configured to receive a battery voltage, and to generate the plurality of regulated voltages and the DC voltage based on providing DC-to-DC conversion of the battery voltage.

In some embodiments, each of the plurality of regulated voltages has a different voltage level.

In various embodiments, the envelope tracker further includes a plurality of decoupling capacitors each coupled between ground and a corresponding one of the plurality of regulated voltages.

In several embodiments, the modulator includes a plurality of switches each coupled between the modulator output voltage and a corresponding one of the plurality of regulated voltages.

In some embodiments, the first filter includes at least one series inductor and at least one shunt capacitor. According to a number of embodiments, the first filter further includes a DC blocking capacitor in series between the modulator output voltage and the power amplifier supply voltage.

In various embodiments, the second filter includes at least one series inductor and at least one shunt capacitor.

In several embodiments, the envelope tracker further includes a controllable delay circuit configured to control a relative delay between an AC path through the first filter and a DC path through the second filter. According to a number of embodiments, the controllable delay circuit includes a plurality of controllable delay buffers each configured to control a delay of a respective one of the plurality of regulated voltages.

In various embodiments, a DC path through the second filter carries at least seventy five percent of the energy provided from the envelope tracker to the power amplifier.

In certain embodiments, the present disclosure relates to an envelope tracker. The envelope tracker includes a power amplifier supply voltage terminal configured to output a power amplifier supply voltage, a DC-to-DC converter configured to output a plurality of regulated voltages based on regulating a battery voltage, a modulator configured to generate a modulator output voltage based on the plurality of regulated voltages and an envelope signal, an AC path filter coupled between the modulator output voltage and the power amplifier supply voltage, and a DC path filter coupled between a DC voltage and the power amplifier supply voltage.

In several embodiments, the DC-to-DC converter is further configured to generate the DC voltage. According to a number of embodiments, the DC-to-DC converter is configured to generate the DC voltage with a different pulse-width modulator sequence relative to each of the plurality of regulated voltages.

In some embodiments, the DC-to-DC converter is configured to receive a battery voltage, and to generate the plurality of regulated voltages and the DC voltage based on providing DC-to-DC conversion of the battery voltage.

In various embodiments, each of the plurality of regulated voltages has a different voltage level.

In several embodiments, the envelope tracker further includes a plurality of decoupling capacitors each coupled between ground and a corresponding one of the plurality of regulated voltages.

In some embodiments, the modulator includes a plurality of switches each coupled between the modulator output voltage and a corresponding one of the plurality of regulated voltages.

In various embodiments, the AC path filter includes at least one series inductor and at least one shunt capacitor. According to a number of embodiments, the AC path filter further includes a DC blocking capacitor in series between the modulator output voltage and the power amplifier supply voltage.

In several embodiments, the DC path filter includes at least one series inductor and at least one shunt capacitor.

In various embodiments, the envelope tracker further includes a controllable delay circuit configured to control a relative delay between an AC path through the first filter and a DC path through the second filter. According to a number of embodiments, the controllable delay circuit includes a plurality of controllable delay buffers each configured to control a delay of a respective one of the plurality of regulated voltages.

In some embodiments, the DC path filter carries at least seventy five percent of the energy provided from the envelope tracker to the power amplifier supply voltage terminal.

In certain embodiments, the present disclosure relates to a mobile device. The mobile device includes a transceiver configured to generate a radio frequency transmit signal, a front end circuit including a power amplifier configured to amplify the radio frequency transmit signal and to receive power from a power amplifier supply voltage, and a power management circuit including an envelope tracker configured to generate the power amplifier supply voltage based on an envelope signal corresponding to an envelope of the radio frequency transmit signal. The envelope tracker includes a DC-to-DC converter configured to output a plurality of regulated voltages, a modulator configured to generate a modulator output voltage based on the plurality of regulated voltages and the envelope signal, a first filter coupled between the modulator output voltage and the power amplifier supply voltage, and a second filter coupled between a DC voltage and the power amplifier supply voltage.

In some embodiments, the DC-to-DC converter is further configured to generate the DC voltage. According to a number of embodiments, the DC-to-DC converter is configured to generate the DC voltage with a different pulse-width modulator sequence relative to each of the plurality of regulated voltages.

In several embodiments, the mobile device further includes a battery that provides a battery voltage, and the DC-to-DC converter is configured to generate the plurality of regulated voltages and the DC voltage based on providing DC-to-DC conversion of the battery voltage.

In some embodiments, each of the plurality of regulated voltages has a different voltage level.

In various embodiments, the envelope tracker further includes a plurality of decoupling capacitors each coupled between ground and a corresponding one of the plurality of regulated voltages.

In several embodiments, the modulator includes a plurality of switches each coupled between the modulator output voltage and a corresponding one of the plurality of regulated voltages.

In some embodiments, the first filter includes at least one series inductor and at least one shunt capacitor. According to a number of embodiments, the first filter further includes a DC blocking capacitor in series between the modulator output voltage and the power amplifier supply voltage.

In several embodiments, the second filter includes at least one series inductor and at least one shunt capacitor.

In various embodiments, the envelope tracker further includes a controllable delay circuit configured to control a relative delay between an AC path through the first filter and a DC path through the second filter. According to a number of embodiments, the controllable delay circuit includes a plurality of controllable delay buffers each configured to control a delay of a respective one of the plurality of regulated voltages.

In some embodiments, a DC path through the second filter carries at least seventy five percent of the energy provided from the envelope tracker to the power amplifier.

In certain embodiments, the present disclosure relates to a method of envelope tracking. The method includes amplifying a radio frequency signal using a power amplifier, supplying power to the power amplifier using a power amplifier supply voltage, outputting a plurality of regulated voltages from a DC-to-DC converter, and generating a modulator output voltage based on the plurality of regulated voltages and an envelope signal using a modulator, the envelope signal corresponding to an envelope of the radio frequency signal. The method further includes controlling the power amplifier supply voltage using a first filter that is between the modulator output voltage and the power amplifier supply voltage, and controlling the power amplifier supply voltage using a second filter that is between a DC voltage and the power amplifier supply voltage.

In several embodiments, the method further includes generating the DC voltage using the DC-to-DC converter. According to a number of embodiments, the method further includes generating the DC voltage with a different pulse-width modulator sequence relative to each of the plurality of regulated voltages.

In various embodiments, the method further includes generating the plurality of regulated voltages and the DC voltage based on providing DC-to-DC conversion of a battery voltage.

In some embodiments, each of the plurality of regulated voltages has a different voltage level.

In several embodiments, the method further includes providing DC blocking using a series DC blocking capacitor of the first filter.

In various embodiments, the method further includes controlling a relative delay between an AC path through the first filter and a DC path through the second filter using a controllable delay circuit.

DETAILED DESCRIPTION OF EMBODIMENTS

Figure 1:
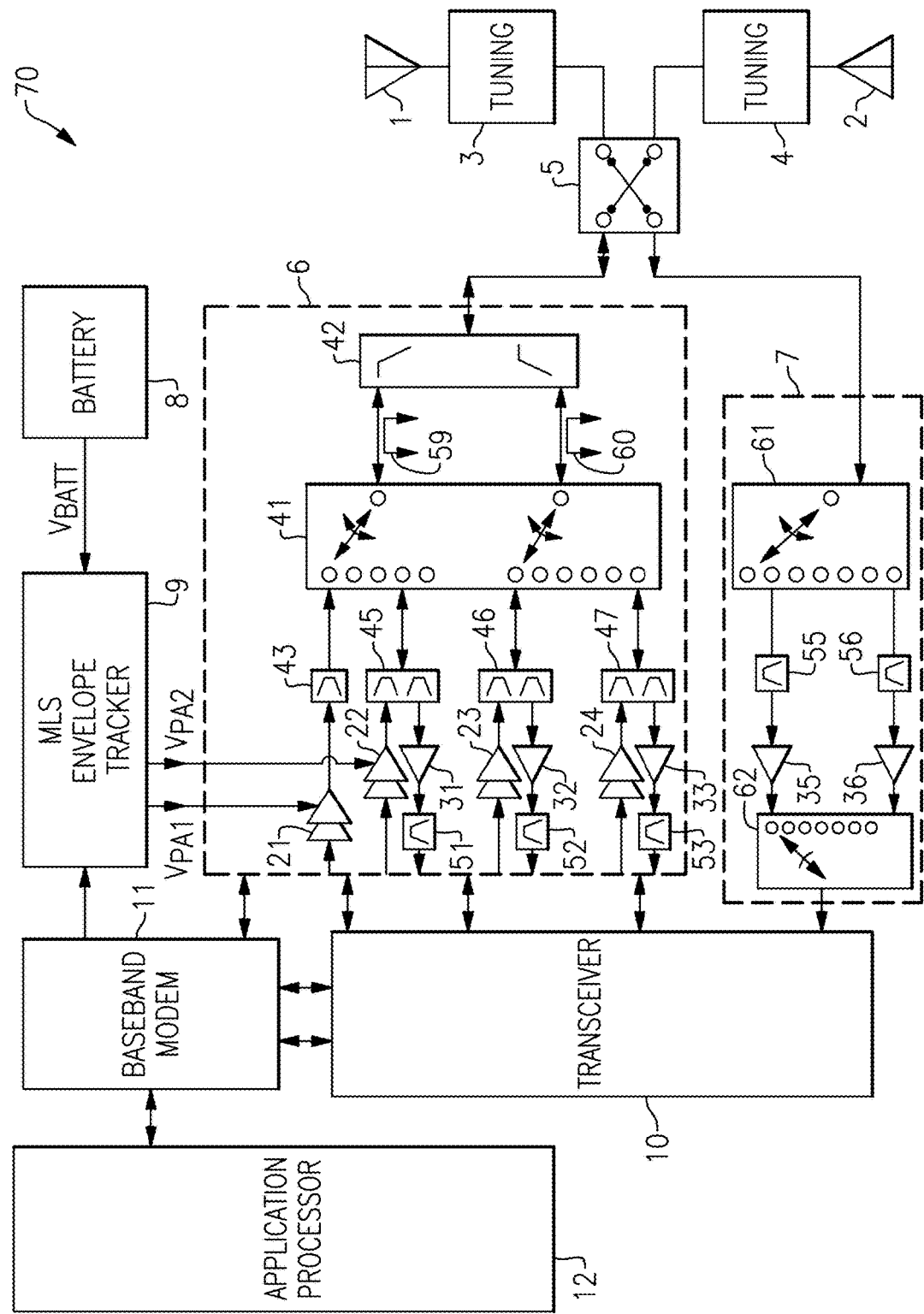
FIG. 1 is a schematic diagram of a mobile device according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

A multi-level envelope tracker can include a multi-level supply (MLS) DC-to-DC converter that generates two or more regulated voltages of different voltage levels, an MLS modulator that outputs a selected regulated voltage chosen from the regulated voltages, and a filter that filters the MLS modulator's output to generate a power amplifier supply voltage for a power amplifier.

A multi-level envelope tracker can suffer from degraded efficiency when both DC and AC currents for a power amplifier supply voltage are circulated through switches of the MLS modulator and/or a common filter. For example, power losses are incurred in the DC resistance of the modulator's switches and/or the filter's inductors.

Although the DC resistance of the switches can be implemented to be low (for instance, a small percentage of the power amplifier's DC load), implementing the switches in this manner results in relatively large layout and/or significant switching losses. For instance, when a desired source impedance is about 0.2 Ohm, the switches of the MLS modulator can be constrained to achieve less than 0.2 Ohm of on-state resistance, which can result in a relatively large switch layout.

Multi-level envelope tracking systems with separate DC and AC paths are provided. In certain embodiments, an envelope tracking system for generating a power amplifier supply voltage for a power amplifier is provided. The envelope tracking system includes an MLS DC-to-DC converter that outputs multiple regulated voltages, an MLS modulator that controls selection of the regulated voltages over time based on an envelope signal corresponding to an envelope of the RF signal amplified by the power amplifier, an AC path filter coupled between an output of the MLS modulator and the power amplifier supply voltage, and a DC path filter coupled between a DC voltage and the power amplifier supply voltage.

By including a DC path through the DC path filter and a separate AC path through the AC path filter, enhanced efficiency of the envelope tracking system can be achieved. For example, low frequency current, such as DC current, can be provided through the DC path filter (for instance, via a filter inductor), thereby relaxing size and/or DC resistance constraints of the modulator's switches. Accordingly, lower switching losses in the AC path can be achieved, thereby enhancing overall system efficiency. In one example, the DC path carries at least 75% of the energy provided by envelope tracking system to the power amplifier.

Since a fast envelope signal can have an energy content centered about DC, the DC path can provide a high efficiency path for low frequency energy content. Moreover, the DC path filter can include components sizes that are relatively small since the filter's inductors can operate without DC saturation. In one example, the DC path filter is implemented with less than about half the size of the AC path filter. In certain implementations, the AC path filter includes a series DC blocking capacitor to aid in blocking DC current through the AC path filter.

In certain implementations, the DC voltage is a regulated voltage from a DC-to-DC converter. For example, the MLS DC-to-DC converter can also be used to generate the DC voltage. In such implementations, the voltage level of the DC voltage can be the same or different as the voltage level of one of the regulated voltages provided to the MLS modulator.

FIG. 1 is a schematic diagram of a mobile device 70 according to one embodiment. The mobile device 70 includes a primary antenna 1, a diversity antenna 2, a primary antenna tuning circuit 3, a diversity antenna tuning circuit 4, a double-pole double-throw (DPDT) antenna diversity switch 5, a primary front end module 6, a diversity front end module 7, a battery 8, an MLS envelope tracker 9, a transceiver 10, a baseband modem 11, and an application processor 12.

Although one embodiment of a mobile device is shown, the teachings herein are applicable to mobile devices implemented in a wide variety of ways. Accordingly, other implementations are possible.

In the illustrated embodiment, the primary front end module 6 includes a first power amplifier 21, a second power amplifier 22, a third power amplifier 23, a fourth power amplifier 24, a first low noise amplifier 31, a second low noise amplifier 32, a third low noise amplifier 33, a diplexer 42, a transmit/receive band switch 41, a transmit filter 43, a first duplexer 45, a second duplexer 46, a third duplexer 47, a first receive filter 51, a second receive filter 52, a third receive filter 53, a first directional coupler 59, and a second directional coupler 60. Additionally, the diversity front end module 7 includes a first low noise amplifier 35, a second low noise amplifier 36, a first receive filter 55, a second receive filter 56, a first receive band selection switch 61, and a second receive band selection switch 62.

Although one embodiment of front end circuitry is shown, other implementations of front end circuitry are possible. For instance, front end circuitry can include power amplifiers (PAs), low noise amplifiers (LNAs), filters, switches, phase shifters, duplexers, and/or other suitable circuitry for processing RF signals transmitted and/or received from one or more antennas. Example functionalities of a front end include but are not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Accordingly, other implementations of primary front end modules, diversity receive front end modules, antenna selection, and/or antenna tuning can be used.

As shown in FIG. 1, the MLS envelope tracker 9 is used to generate one or more power amplifier supply voltages for power amplifiers used in the mobile device 70 to amplify RF signals for wireless transmission. In the illustrated embodiment, the MLS envelope tracker 9 receives a battery voltage $V_{BATT}$ from the battery 8, and generates a first power amplifier supply voltage $V_{PA1}$ for the first power amplifier 21 and a second power amplifier supply voltage $V_{PA2}$ for the first power amplifier 22. Although an example in which the MLS envelope tracker 9 generates two power amplifier supply voltages is shown, the MLS envelope tracker 9 can generate more or fewer power amplifier supply voltages.

The MLS envelope tracker 9 controls the first power amplifier supply voltage $V_{PA1}$ to track an envelope of a first RF signal amplified by the first power amplifier 21. Additionally, the MLS envelope tracker 9 controls the second power amplifier supply voltage $V_{PA2}$ to track an envelope of a second RF signal amplified by the second power amplifier 22. In certain implementations, the MLS envelope tracker 9 receives one or more envelope signals from the baseband modem 11. For example, the MLS envelope tracker 9 can receive a first envelope signal indicating an envelope of the first RF signal and a second envelope signal indicating an envelope of the second RF signal.

The battery 8 can be any suitable battery for use in the mobile device 70, including, for example, a lithium-ion battery. The battery voltage $V_{BATT}$ is regulated by a DC-to-DC converter of the MLS envelope tracker 9 to generate regulated voltages used for multi-level envelope tracking in accordance with the teachings herein.

The transceiver 10 generates RF signals for transmission and processes incoming RF signals received from the primary antenna 1 and the diversity antenna 2. It will be understood that various functionalities associated with the transmission and receiving of RF signals can be achieved by one or more components that are collectively represented in FIG. 1 as the transceiver 10. In one example, separate components (for instance, separate circuits or dies) can be provided for handling certain types of RF signals.

The baseband modem 11 provides the transceiver 10 with digital representations of transmit signals, which the transceiver 10 processes to generate RF signals for transmission. The baseband modem 11 also processes digital representations of received signals provided by the transceiver 10.

As shown in FIG. 1, the baseband modem 11 is coupled to the application processor 12, which serves to provide primary application processing in the mobile device 70. The application processor 12 can provide a wide variety of functions, such as providing system capabilities suitable for supporting applications, including, but not limited to, memory management, graphics processing, and/or multimedia decoding.

Although the mobile device 70 illustrates one example of an RF system including a multi-level envelope tracker, a wide variety of RF systems can include a multi-level envelope tracker implemented in accordance with the teachings herein.

FIGS. 2-3C, 5 and 6 depict schematic diagram of various embodiments of envelope tracking systems for a power amplifier. However, the teachings herein are applicable to envelope trackers implemented in a wide variety of ways. Accordingly, other implementations are possible.

Figure 2:
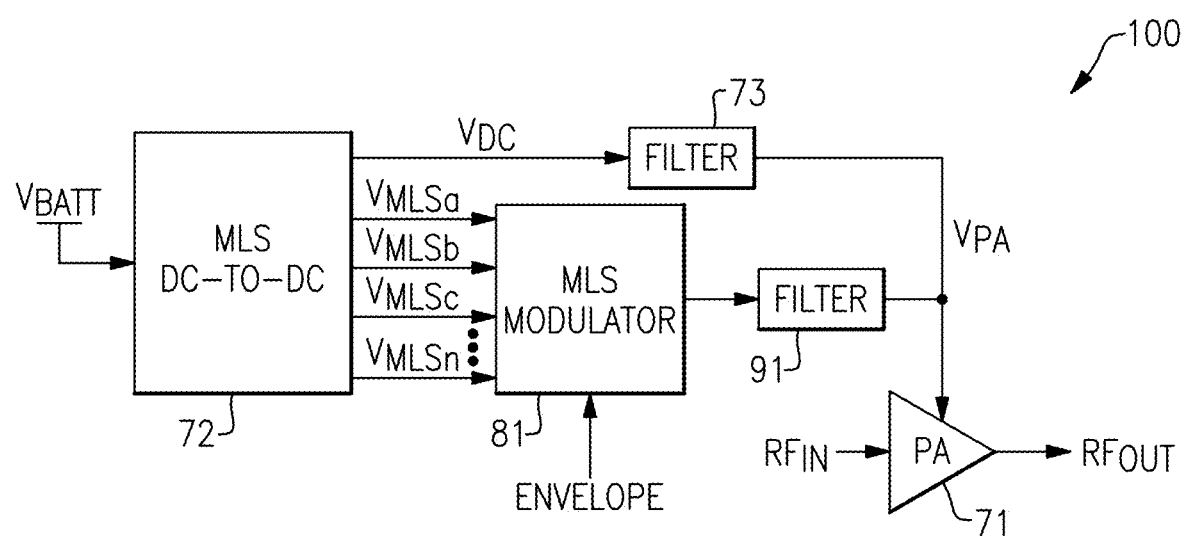
FIG. 2 is a schematic diagram of one embodiment of an envelope tracking system for a power amplifier.

FIG. 2 is a schematic diagram of one embodiment of an envelope tracking system 100 for a power amplifier 71. The envelope tracking system 100 includes an MLS DC-to-DC converter 72, a DC path filter 73, an MLS modulator 81, and an AC path filter 91. The MLS DC-to-DC converter 72 is also referred to herein as a switching regulator.

The power amplifier 71 amplifies an RF input signal $RF_{IN}$ to generate an RF output signal $RF_{OUT}$. The MLS modulator 81 receives an envelope signal (ENVELOPE), which changes in relation to an envelope of the RF input signal $RF_{IN}$. The envelope signal can be analog or digital.

In the illustrated embodiment, the MLS DC-to-DC converter 72 receives a battery voltage $V_{BATT}$, and provides DC-to-DC conversion to generate a variety of regulated voltages $V_{MLSa}$, $V_{MLSb}$, $V_{MLSc}$ ... $V_{MLSn}$ of different voltage levels. Although an example in which four MLS voltages is depicted, the MLS DC-to-DC converter 72 can generate more or fewer MLS voltages as indicated by the ellipses. In this embodiment, the MLS DC-to-DC converter 72 also generates the DC voltage $V_{DC}$ by regulating the battery voltage $V_{BATT}$. The DC voltage $V_{DC}$ can be of the same or different voltage level as one of the regulated voltages $V_{MLSa}$, $V_{MLSb}$, $V_{MLSc}$ ... $V_{MLSn}$.

The MLS modulator 81 receives the regulated voltages $V_{MLSa}$, $V_{MLSb}$, $V_{MLSc}$ ... $V_{MLSn}$ and the envelope signal, and outputs a modulator output voltage to the AC path filter 91. In certain implementations, the MLS modulator 81 controls the outputted voltage based on selecting a suitable regulated voltage over time based on the envelope signal. For example, the MLS modulator 81 can include a bank of switches for selectively connecting the regulated voltages $V_{MLSa}$, $V_{MLSb}$, $V_{MLSc}$ ... $V_{MLSn}$ to the modulator's output based on a value of the envelope signal.

The DC path filter 73 and the AC path filter 91 filter the DC voltage $V_{DC}$ from the MLS DC-to-DC converter 72 and the output of MLS modulator 81, respectively, to thereby generate a power amplifier supply voltage $V_{PA}$ for the power amplifier 71.

By including a DC path through the DC path filter 73 and a separate AC path through the AC path filter 91, enhanced efficiency of the envelope tracking system 100 can be achieved. For example, low frequency current (including, but not limited to, DC current) can be provided through the DC path filter 73, thereby relaxing size and/or DC resistance constraints of the MLS modulator's switches.

Accordingly, lower switching losses in the AC path can be achieved, thereby enhancing overall system efficiency. In one example, the DC path carries at least 75% of the energy provided by envelope tracking system 100 to the power amplifier 71.

Figure 3A:
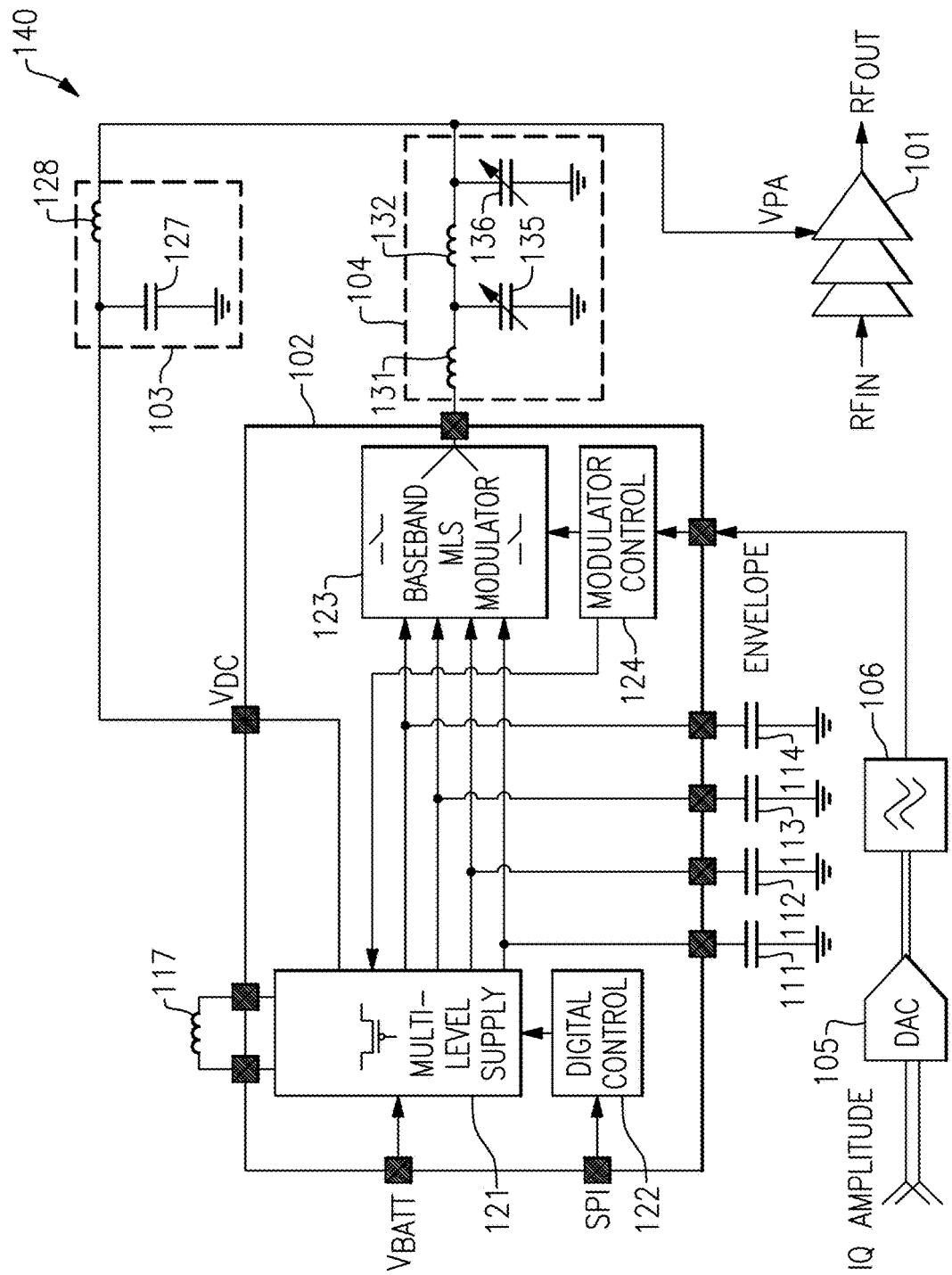
FIG. 3A is a schematic diagram of another embodiment of an envelope tracking system for a power amplifier.

FIG. 3A is a schematic diagram of another embodiment of an envelope tracking system 140 for a power amplifier 101. The envelope tracking system 140 includes an envelope tracking integrated circuit (IC) 102, a DC path filter 103, an AC path filter 104, DAC circuitry 105, an envelope filter 106, first to fourth decoupling capacitors 111-114, respectively, and an inductor 117.

Although one embodiment of an envelope tracking system is shown in FIG. 3A, the teachings herein are applicable to envelope tracking systems implemented in a wide variety of ways. Accordingly, other implementations are possible.

In the illustrated embodiment, the envelope tracking IC 102 includes MLS switching circuitry 121, a digital control circuit 122, a baseband MLS modulator 123, and a modulator control circuit 124. The envelope tracking IC 102 of FIG. 3A is depicted with various pins or pads for providing a variety of functions, such as receiving a battery voltage ($V_{BATT}$), communicating over a serial peripheral interface (SPI), outputting a DC voltage $V_{DC}$, receiving an envelope signal (ENVELOPE), connecting to the decoupling capacitors 111-114, and connecting to the inductor 117. An envelope tracking IC is also referred to herein in as an envelope tracking semiconductor die or chip.

The MLS switching circuitry 121 controls a current through the inductor 117 to provide voltage regulation. For example, the MLS switching circuitry 121 can include switches and a controller that turns on and off the switches using any suitable regulation scheme (including, but not limited to, pulse-width modulation) to provide DC-to-DC conversion. In the illustrated embodiment, the MLS switching circuitry 121 outputs four regulated MLS voltages of different voltage levels and a regulated DC voltage $V_{DC}$. However, the MLS switching circuitry 121 can be implemented to output more or fewer regulated voltages.

As shown in FIG. 3A, the MLS switching circuitry 121 is controlled by the digital control circuit 122. The digital control circuit 122 can provide programmability to the MLS switching circuitry 121 including, but not limited to, control over voltage levels of one or more regulated voltages outputted by the MLS switching circuitry 121. As shown in FIG. 3A, the digital control circuit 122 is coupled to the SPI bus. In certain implementations, the digital control circuit 122 controls the MLS switching circuitry 121 based on data received over the SPI bus and/or other chip interface.

The MLS switching circuitry 121 can also be controlled by the modulator control circuit 124. In one example, the regulated DC voltage $V_{DC}$ is controlled at least in part by the modulator control circuit 124.

The baseband MLS modulator 123 includes an output coupled to the power amplifier supply voltage $V_{PA}$ through the AC path filter 104. In certain implementations, the baseband MLS modulator 123 includes switches coupled between each of the regulated MLS voltages and the AC path filter 104. Additionally, the modulator's switches are selectively opened or closed by the modulator controller 124 based on the envelope signal.

In the illustrated embodiment, the DC path filter 103 includes a shunt capacitor 127 and a series inductor 128. Additionally, the AC path filter 104 includes a first series inductor 131, a second series inductor 132, a first shunt capacitor 135, and a second shunt capacitor 136. Although example implementations of a DC path filter and an AC path filter are depicted in FIG. 3A, the teachings herein are applicable to DC path filters and AC path filters implemented in a wide variety of ways. Accordingly, other implementations of filters can be used in accordance with the teachings herein.

In certain implementations, one or more components of a filter are controllable (for instance, digitally programmable and/or analog-tuned) to provide enhanced flexibility and/or configurability. For example, in the illustrated embodiment, the first shunt capacitor 135 and the second shunt capacitor 136 are controllable. Although two examples of controllable filter components are shown, other filter components can additionally or alternatively be implemented to be controllable.

Figure 3B:
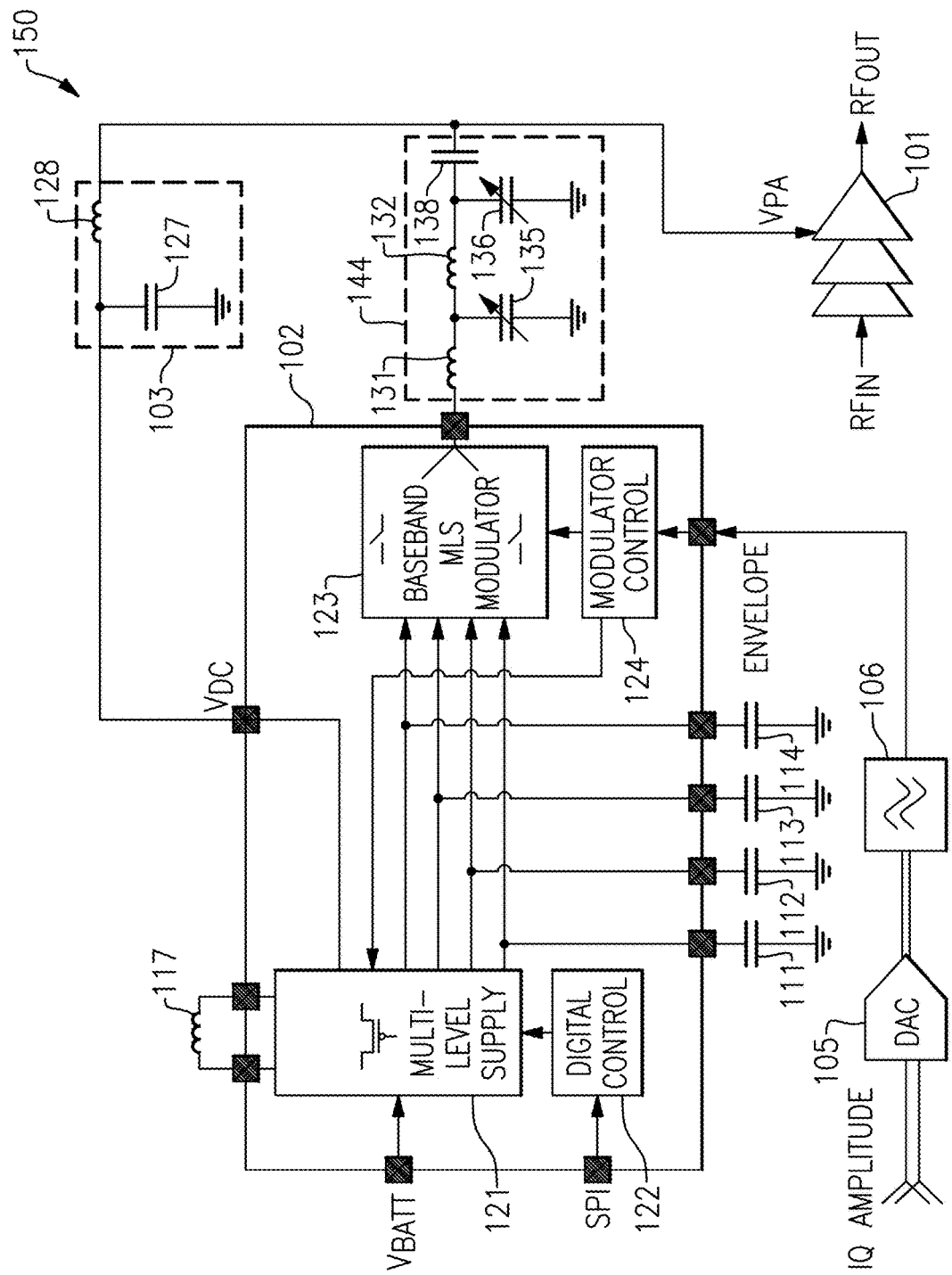
FIG. 3B is a schematic diagram of another embodiment of an envelope tracking system for a power amplifier.

FIG. 3B is a schematic diagram of another embodiment of an envelope tracking system 150 for a power amplifier 101. The envelope tracking system 150 of FIG. 3B is similar to the envelope tracking system 140 of FIG. 3A, except that the envelope tracking system 150 includes a different implementation of an AC path filter 144.

For example, in comparison to the AC path filter 104 of FIG. 3A, the AC path filter 144 of FIG. 3B further includes a DC blocking capacitor 138 for blocking low frequency current through the AC path filter 144. In the illustrated embodiment, the DC blocking capacitor 138 is coupled to the output of the AC path filter 144.

By including the DC blocking capacitor 138, lower switching losses in the AC path can be achieved, thereby enhancing overall system efficiency. For example, inclusion of the DC blocking capacitor 138 can aid in increasing a percentage of energy carried by the DC path through the DC path filter 103 relative to the energy carried by the AC path through the AC path filter 144. In one example, the DC path through the DC path filter 103 carries at least 75% of the energy provided by envelope tracking system 150 to the power amplifier 101.

Figure 3C:
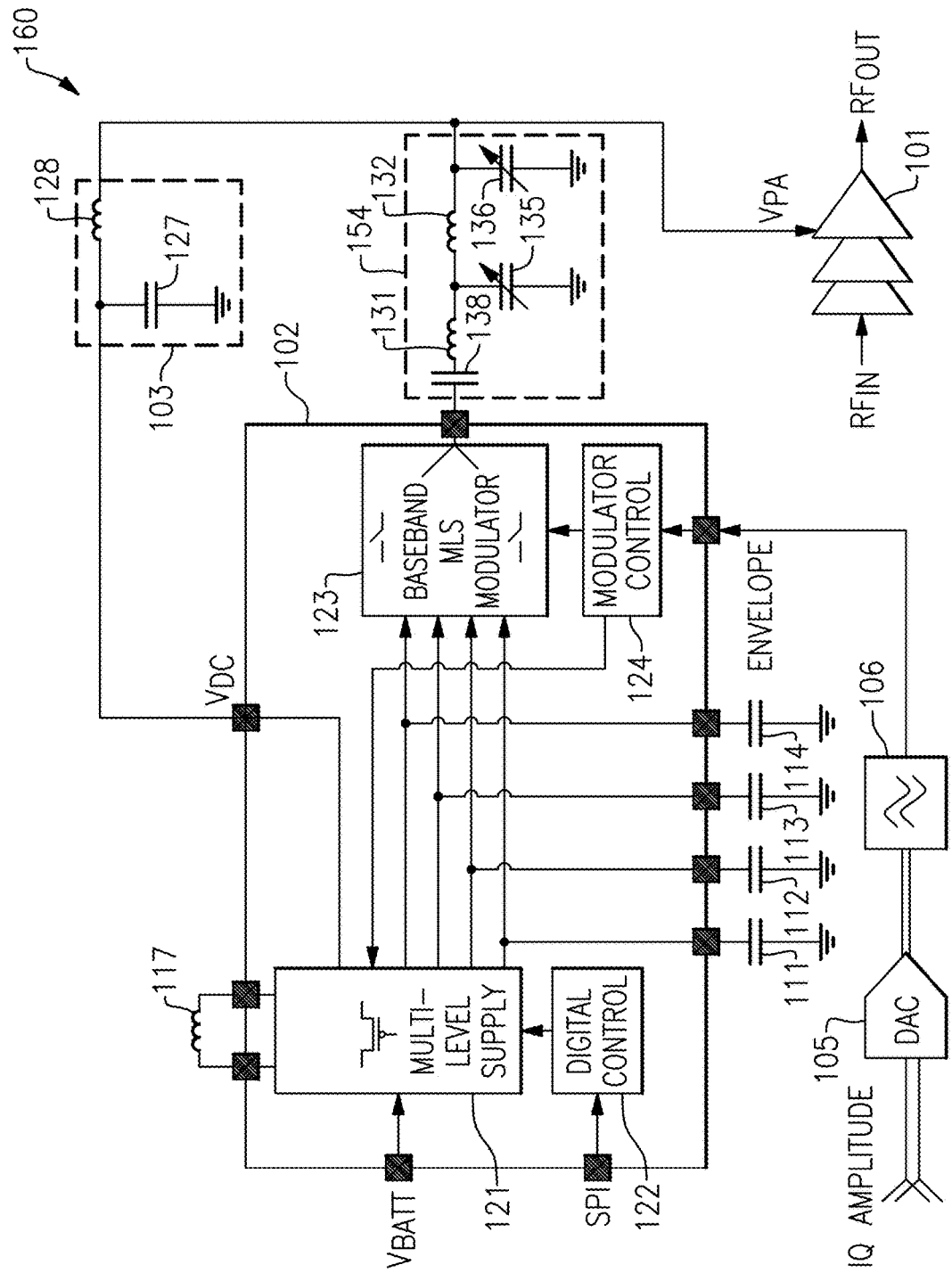
FIG. 3C is a schematic diagram of another embodiment of an envelope tracking system for a power amplifier.

FIG. 3C is a schematic diagram of another embodiment of an envelope tracking system 160 for a power amplifier 101. The envelope tracking system 160 of FIG. 3C is similar to the envelope tracking system 150 of FIG. 3B, except that the envelope tracking system 160 includes a different implementation of an AC path filter 154.

For example, in comparison to the AC path filter 144 of FIG. 3B, the AC path filter 154 of FIG. 3C includes the DC blocking capacitor 138 coupled to the filter's input. A DC blocking capacitor can be included in an AC path filter in a wide variety of locations, including, for example, at the input, at the output, or along the signal path between the input and the output.

Figure 3D:
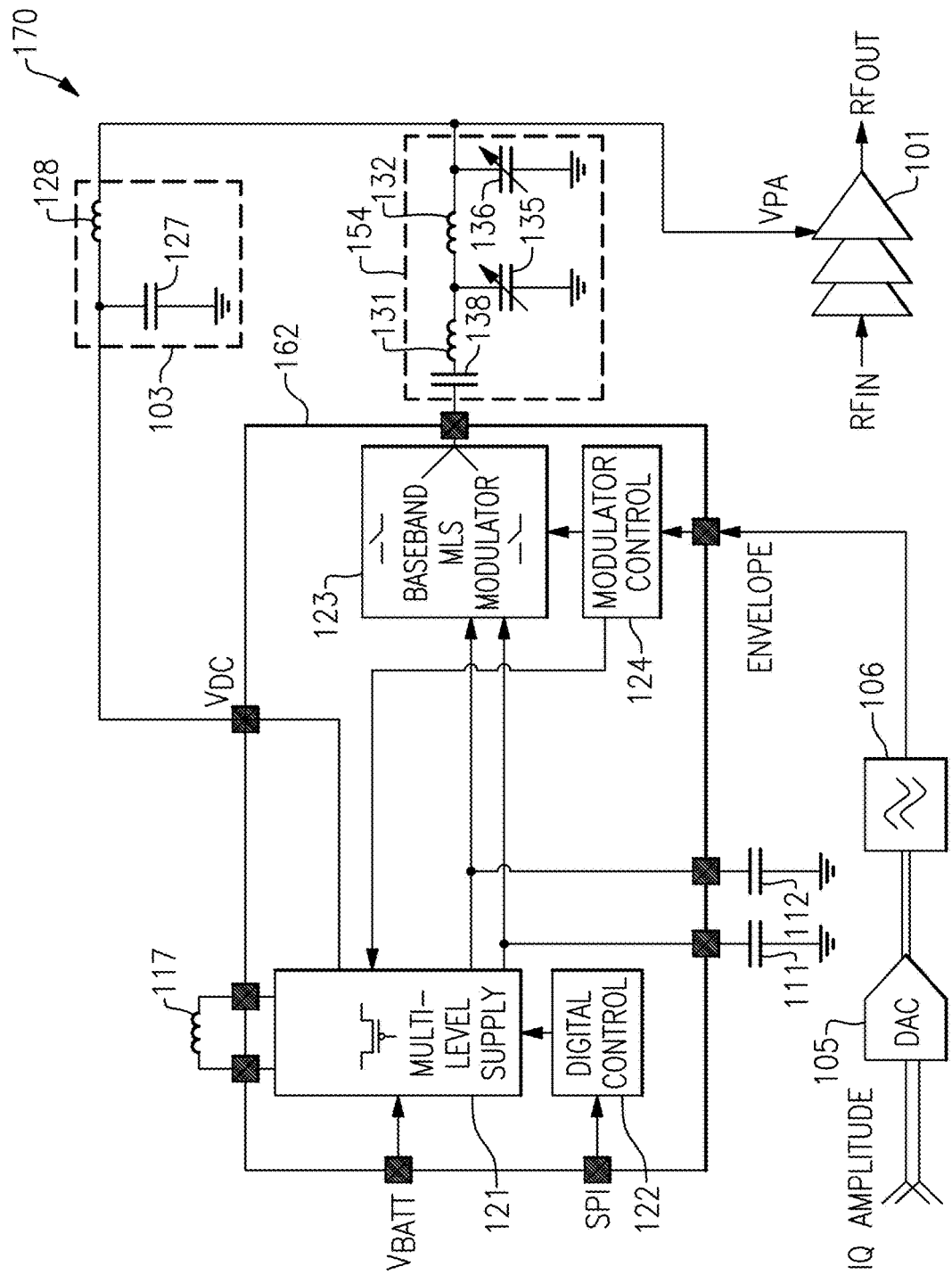
FIG. 3D is a schematic diagram of another embodiment of an envelope tracking system for a power amplifier.

FIG. 3D is a schematic diagram of another embodiment of an envelope tracking system 170 for a power amplifier 101. The envelope tracking system 170 of FIG. 3D is similar to the envelope tracking system 140 of FIG. 3A, except that the envelope tracking system 170 includes an envelope tracking IC 102 operating with two MLS regulated voltages. Additionally the decoupling capacitors 113 and 114 have been omitted in view of the fewer number of MLS regulated voltages.

The envelope tracking system 170 of FIG. 3D has the advantage of lower complexity. Moreover, the envelope tracking system 170 is well-suited for applications using symbol by symbol tracking, which can be suitable for high bandwidth modulations. For example, when using symbol by symbol tracking, two MLS voltages can be programmed and used in succession at the symbol rate (for instance, 16 us). Thus, the MLS modulator 123 can change the voltage used for generating the power amplifier supply voltage by switching to the new voltage holding capacitor.

When using symbol by symbol tracking, less filtering can be used, but the AC/DC split is nevertheless beneficial and avoids a need for a series switch.

Figure 4:
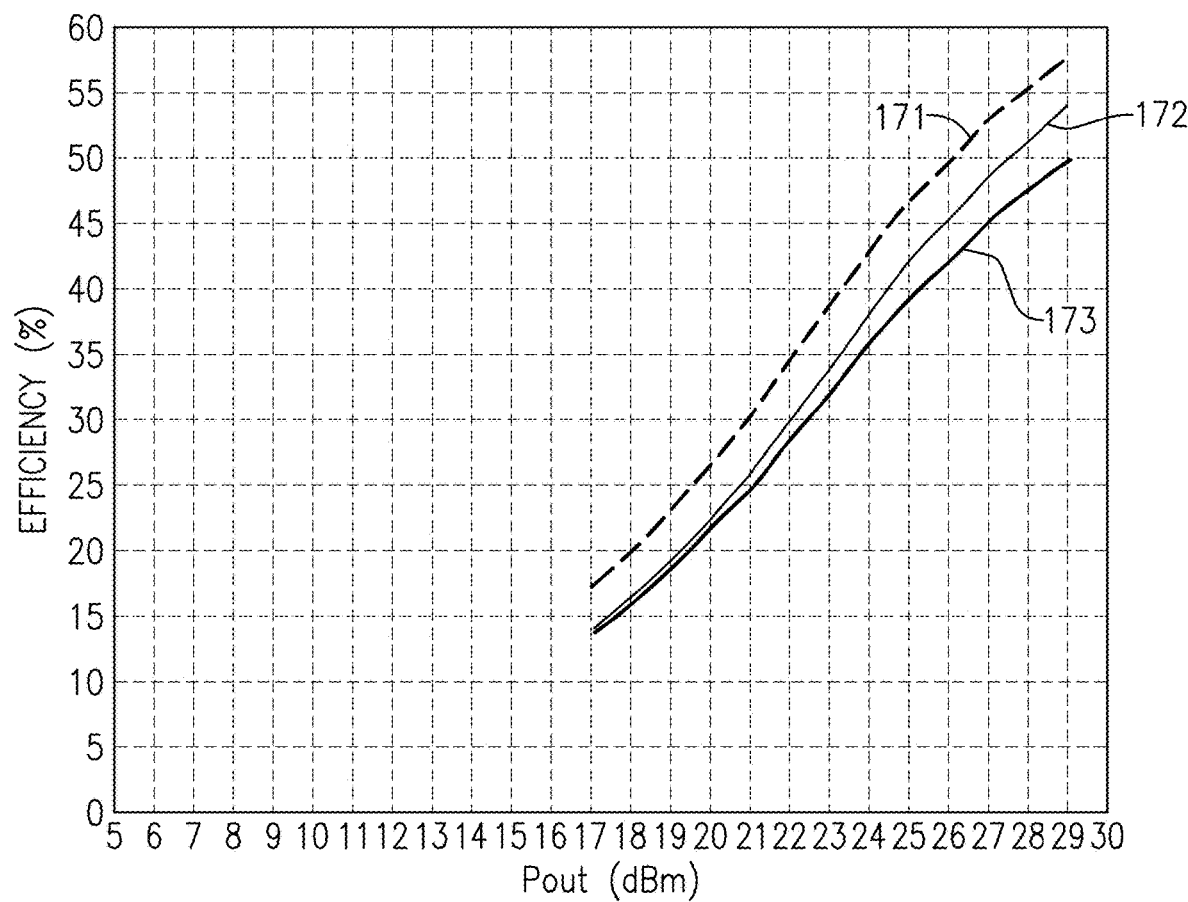
FIG. 4 is a graph of efficiency versus output power.

FIG. 4 is a graph of efficiency versus output power. The graph includes three plots of combined power amplifier and envelope tracker efficiency versus output power for different simulation scenarios. For example, the first plot 171 corresponds to a simulation in which 0.1 Ohm of switch resistance is included in the DC path, a second plot 172 of LTE efficiency, and a third plot 173 in which 1.0 Ohm of switch resistance is included in the DC path. Since lower DC path resistance can be achieved by providing a separate AC path and DC path, enhanced efficiency can also be realized.

Although specific examples of simulation results for envelope tracking systems are shown in FIG. 4, other simulations results are possible. For example, simulation results can vary based on a wide variety of factors, including, but not limited to, simulation parameters (including operating frequency), circuit topology, and/or fabrication processes.

Figure 5:
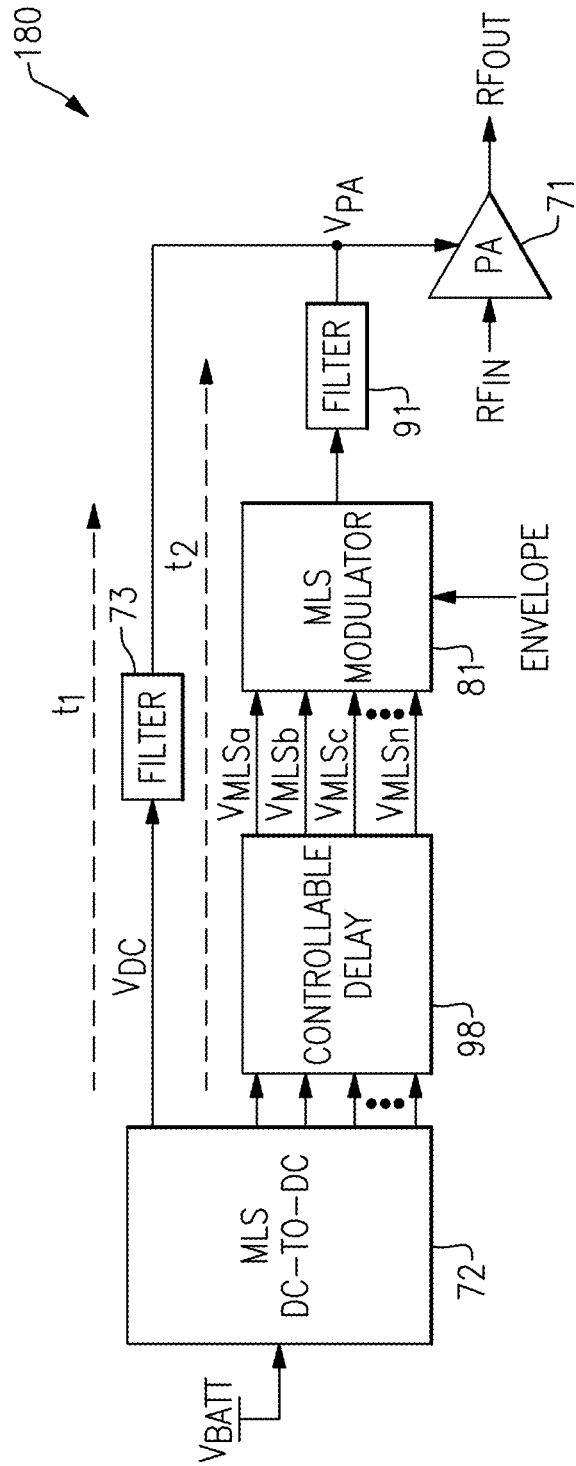
FIG. 5 is a schematic diagram of another embodiment of an envelope tracking system for a power amplifier.

FIG. 5 is a schematic diagram of another embodiment of an envelope tracking system 180 for a power amplifier 71. The envelope tracking system 180 of FIG. 5 is similar to the envelope tracking system 100 of FIG. 2, except that the envelope tracking system 150 further includes a controllable delay circuit 98.

In the illustrated embodiment, the envelope tracking system 180 operates with a DC path delay $t_1$ from the MLS DC-to-DC converter 72 to a supply input of the power amplifier 71 through the DC path filter 73. Additionally, the envelope tracking system 180 operates with an AC path delay $t_2$ from the MLS DC-to-DC converter 72 to the supply input of the power amplifier 71 through the controllable delay circuit 98, the MLS modulator 81, and the AC path filter 91.

By including the controllable delay circuit 98, a relative delay between the AC path and the DC path can be controlled to enhance the efficiency of the envelope tracking system 180. In certain implementations, a delay of the controllable delay circuit 98 operates to substantially match the DC path delay $t_1$ and the AC path delay $t_2$ with a desired phase shift to enhance efficiency.

For example, absent compensation for the difference in delay, currents of the AC path and DC path can fight due to the control bandwidth of the DC path being smaller than the control bandwidth of the AC path. In this example, the AC path is delayed by the controllable delay circuit 98 to control a relative delay of the DC path as seen by the load. In certain implementations, a phase shift of about 90 degrees across the bandwidth where combining occurs provides relatively high efficiency. In certain implementations, a digital state machine or other suitable control circuit operates to provide control that achieves about 90 degrees of phase delay.

Figure 6:
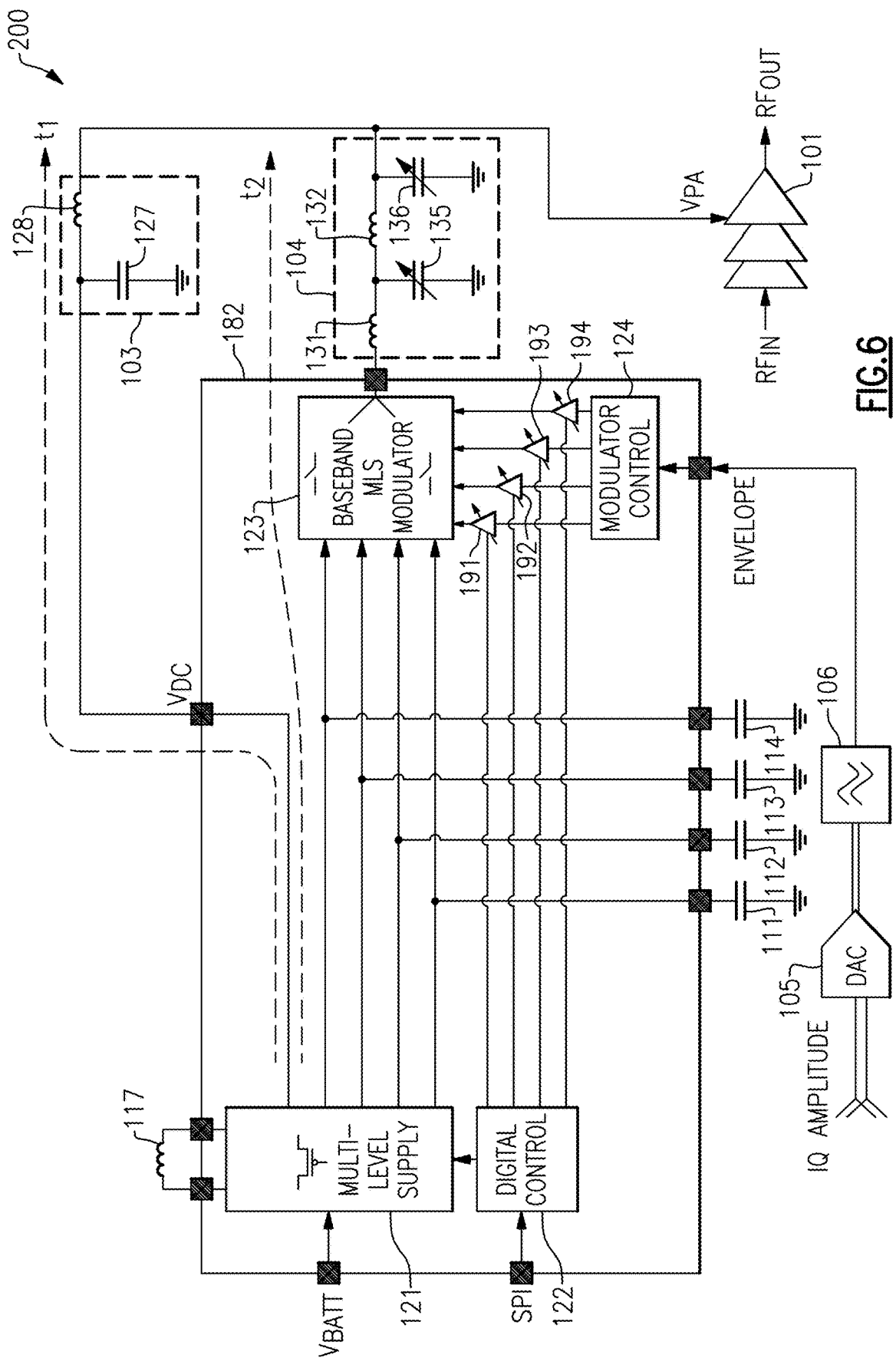
FIG. 6 is a schematic diagram of another embodiment of an envelope tracking system for a power amplifier.

FIG. 6 is a schematic diagram of another embodiment of an envelope tracking system 200 for a power amplifier 101. The envelope tracking system 200 of FIG. 6 is similar to the envelope tracking system 140 of FIG. 3A, except that the envelope tracking system 200 includes a different implementation of an envelope tracking IC 182.

For example, in comparison to the envelope tracking IC 102 of FIG. 3A, the envelope tracking IC 182 of FIG. 6 further includes controllable delay buffers 191-194. As shown in FIG. 3A, the controllable delay buffers 191-194 provide controllable delay to each MLS regulated voltage generated by the MLS switching circuit 121, thereby allowing for relatively adjustment of the AC path delay $t_2$ relative to the DC path delay $t_1$.

In this embodiment, the delay of the controllable delay buffers 191-194 are separately controllable by the digital control circuit 122, thereby providing enhanced flexibility in accounting for any variations in delay between the various MLS regulated voltage paths.

Figure 7:
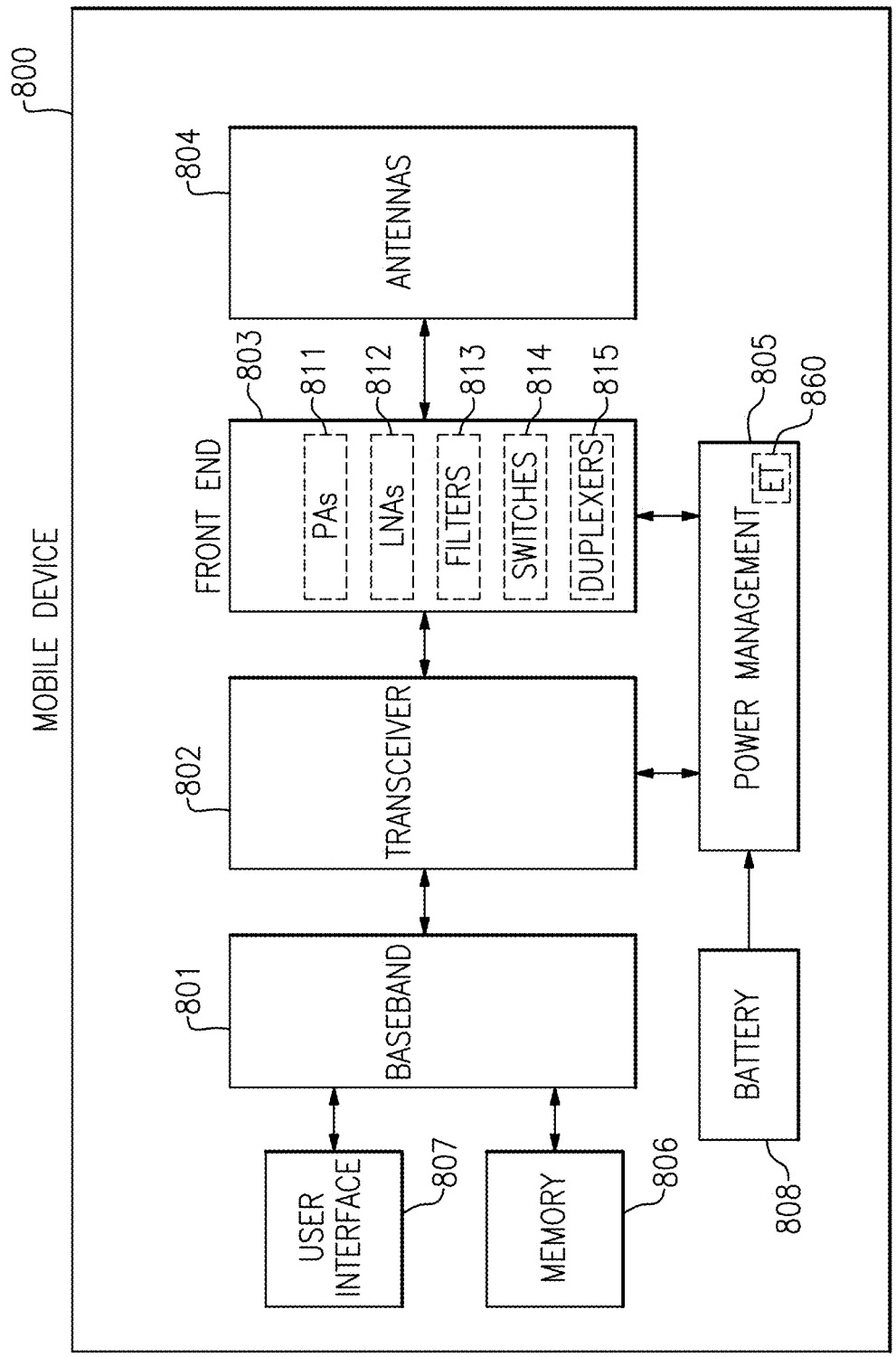
FIG. 7 is a schematic diagram of a mobile device according to another embodiment.

FIG. 7 is a schematic diagram of a mobile device 800 according to another embodiment. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an MLS envelope tracker 860 implemented in accordance with one or more features of the present disclosure.

As shown in FIG. 7, the power management system 805 receives a battery voltage form the battery 808. The battery 808 can be any suitable battery for use in the mobile device 800, including, for example, a lithium-ion battery.

Figure 8:
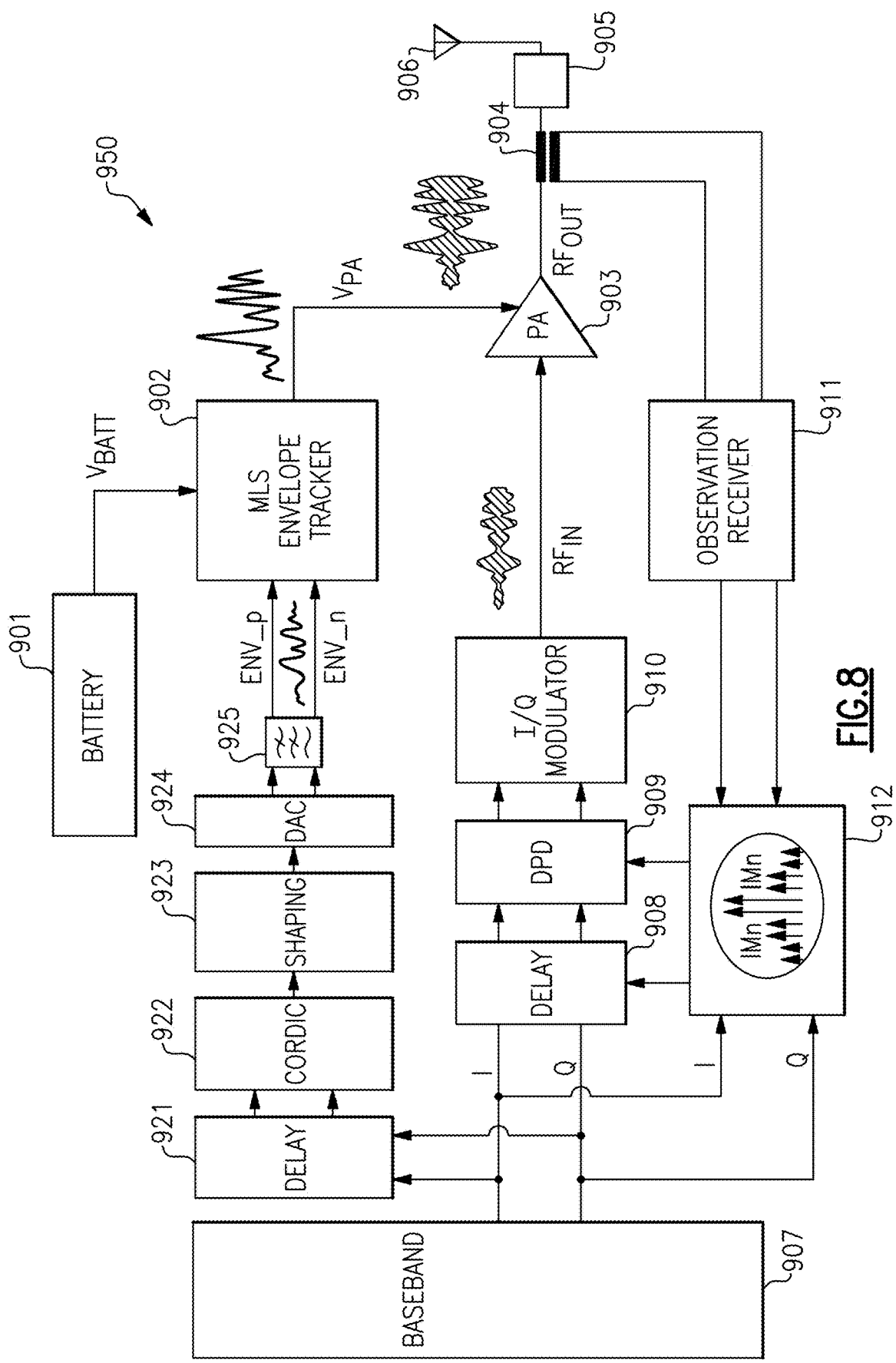
FIG. 8 is a schematic diagram of one embodiment of a communication system for transmitting radio frequency (RF) signals.

FIG. 8 is a schematic diagram of one embodiment of a communication system 950 for transmitting RF signals. The communication system 950 includes a battery 901, an MLS envelope tracker 902, a power amplifier 903, a directional coupler 904, a duplexing and switching circuit 905, an antenna 906, a baseband processor 907, a signal delay circuit 908, a digital pre-distortion (DPD) circuit 909, an I/Q modulator 910, an observation receiver 911, an intermodulation detection circuit 912, an envelope delay circuit 921, a coordinate rotation digital computation (CORDIC) circuit 922, a shaping circuit 923, a digital-to-analog converter 924, and a reconstruction filter 925.

The communication system 950 of FIG. 8 illustrates one example of an RF system that can include an envelope tracking system implemented in accordance with one or more features of the present disclosure. However, the teachings herein are applicable to RF systems implemented in a wide variety of ways.

The baseband processor 907 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 907 can be any suitable processor for processing baseband signals. For instance, the baseband processor 907 can include a digital signal processor, a microprocessor, a programmable core, or any combination thereof.

The signal delay circuit 908 provides adjustable delay to the I and Q signals to aid in controlling relative alignment between the differential envelope signal ENV_p, ENV_n provided to the MLS envelope tracker 902 and the RF signal $RF_{IN}$ provided to the power amplifier 903. The amount of delay provided by the signal delay circuit 908 is controlled based on amount of intermodulation in adjacent bands detected by the intermodulation detection circuit 912.

The DPD circuit 909 operates to provide digital shaping to the delayed I and Q signals from the signal delay circuit 908 to generate digitally pre-distorted I and Q signals. In the illustrated embodiment, the DPD provided by the DPD circuit 909 is controlled based on amount of intermodulation detected by the intermodulation detection circuit 912. The DPD circuit 909 serves to reduce a distortion of the power amplifier 903 and/or to increase the efficiency of the power amplifier 903.

The I/Q modulator 910 receives the digitally pre-distorted I and Q signals, which are processed to generate the RF signal $RF_{IN}$. For example, the I/Q modulator 910 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 910 can include one or more filters configured to filter frequency content of signals processed therein.

The envelope delay circuit 921 delays the I and Q signals from the baseband processor 907. Additionally, the CORDIC circuit 922 processes the delayed I and Q signals to generate a digital envelope signal representing an envelope of the RF signal $RF_{IN}$. Although FIG. 8 illustrates an implementation using the CORDIC circuit 922, an envelope signal can be obtained in other ways.

The shaping circuit 923 operates to shape the digital envelope signal to enhance the performance of the communication system 950. In certain implementations, the shaping circuit 923 includes a shaping table that maps each level of the digital envelope signal to a corresponding shaped envelope signal level. Envelope shaping can aid in controlling linearity, distortion, and/or efficiency of the power amplifier 903.

In the illustrated embodiment, the shaped envelope signal is a digital signal that is converted by the DAC 924 to a differential analog envelope signal. Additionally, the differential analog envelope signal is filtered by the reconstruction filter 925 to generate a differential envelope signal ENV_p, ENV_n suitable for use by a differential envelope amplifier of the MLS envelope tracker 902. In certain implementations, the reconstruction filter 925 includes a differential low pass filter.

Although one example of envelope signaling is shown, the teachings herein are applicable to envelope signaling implemented in a wide variety of ways. For instance, in another example, the DAC 924 and the reconstruction filter 925 are omitted in favor of providing the MLS envelope tracker 902 with digital envelope data.

With continuing reference to FIG. 8, the MLS envelope tracker 902 receives the envelope signal from the reconstruction filter 925 and a battery voltage $V_{BATT}$ from the battery 901, and uses the differential envelope signal ENV_p, ENV_n to generate a power amplifier supply voltage $V_{CC\_PA}$ for the power amplifier 903 that changes in relation to the envelope of the RF signal $RF_{IN}$. The power amplifier 903 receives the RF signal $RF_{IN}$ from the I/Q modulator 910, and provides an amplified RF signal $RF_{OUT}$ to the antenna 906 through the duplexing and switching circuit 905, in this example.

The directional coupler 904 is positioned between the output of the power amplifier 903 and the input of the duplexing and switching circuit 905, thereby allowing a measurement of output power of the power amplifier 903 that does not include insertion loss of the duplexing and switching circuit 905. The sensed output signal from the directional coupler 904 is provided to the observation receiver 911, which can include mixers for providing down conversion to generate downconverted I and Q signals, and DACs for generating I and Q observation signals from the downconverted I and Q signals.

The intermodulation detection circuit 912 determines an intermodulation product between the I and Q observation signals and the I and Q signals from the baseband processor 907. Additionally, the intermodulation detection circuit 912 controls the DPD provided by the DPD circuit 909 and/or a delay of the signal delay circuit 908 to control relative alignment between the differential envelope signal ENV_p, ENV_n and the RF signal $RF_{IN}$. In another embodiment, the intermodulation detection circuit 912 additionally or alternatively controls a delay of the signal delay circuit 921.

By including a feedback path from the output of the power amplifier 903 and baseband, the I and Q signals can be dynamically adjusted to optimize the operation of the communication system 950. For example, configuring the communication system 950 in this manner can aid in providing power control, compensating for transmitter impairments, and/or in performing DPD.

Although illustrated as a single stage, the power amplifier 903 can include one or more stages. Furthermore, the teachings herein are applicable to communication systems including multiple power amplifiers.

Figure 9:
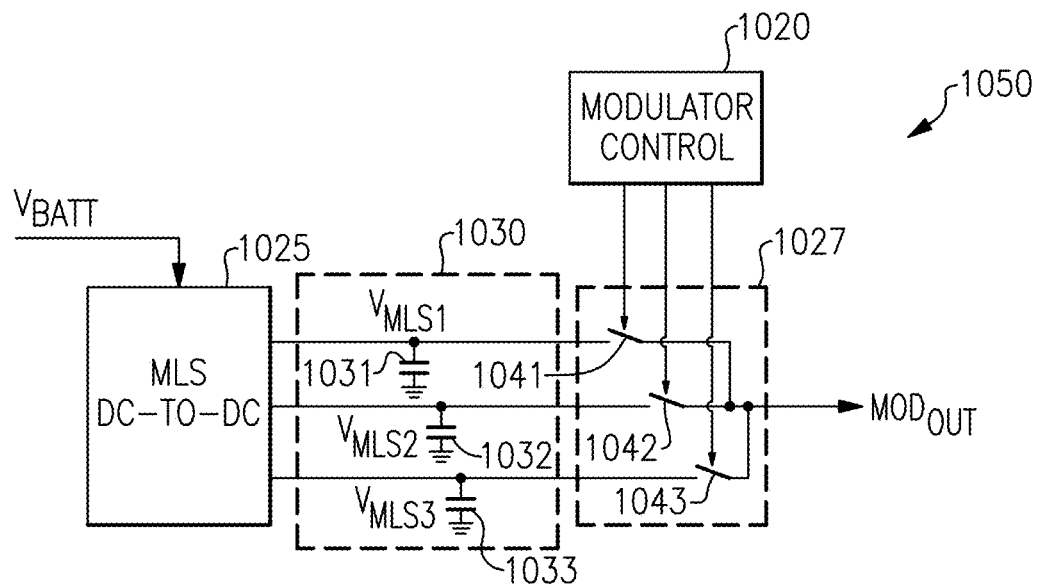
FIG. 9 is a schematic diagram of a multi-level supply (MLS) modulation system according to one embodiment.

FIG. 9 is a schematic diagram of an MLS modulation system 1050 according to one embodiment. The MLS modulation system 1050 includes a modulator control circuit 1020, an MLS DC-to-DC converter 1025, a modulator switch bank 1027, and a decoupling capacitor bank 1030.

The MLS modulation system 1050 of FIG. 9 illustrates one implementation of MLS modulator circuitry suitable for incorporation in a multi-level envelope tracker. However, other implementations of MLS modulator circuitry can be included in multi-level envelope trackers implemented in accordance with the teachings herein.

The MLS DC-to-DC converter 1025 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the MLS DC-to-DC converter 1025 can generate more or fewer regulated voltages. In certain implementations, at least a portion of the regulated voltages are boosted relative to the battery voltage $V_{BATT}$. Additionally or alternatively, one or more of the regulated voltages is a buck voltage having a voltage lower than the battery voltage $V_{BATT}$.

The decoupling capacitor bank 1030 aids in stabilizing the regulated voltages generated by the MLS DC-to-DC converter 1025. For example, the decoupling capacitor bank 1030 of FIG. 9 includes a first decoupling capacitor 1031 for decoupling the first regulated voltage $V_{MLS1}$, a second decoupling capacitor 1032 for decoupling the second regulated voltage $V_{MLS2}$, and a third decoupling capacitor 1033 for decoupling the third regulated voltage $V_{MLS3}$.

With continuing reference to FIG. 9, the modulator switch bank 1027 includes a first switch 1041 connected between the modulator's output ($MOD_{OUT}$) and the first regulated voltage $V_{MLS1}$, a second switch 1042 connected between the modulator's output and the second regulated voltage $V_{MLS2}$, and a third switch 1043 connected between the modulator's output and the third regulated voltage $V_{MLS3}$. The modulator control 1020 operates to selectively open or close the switches 1041-1043 to thereby control modulator's output.

Figure 10:
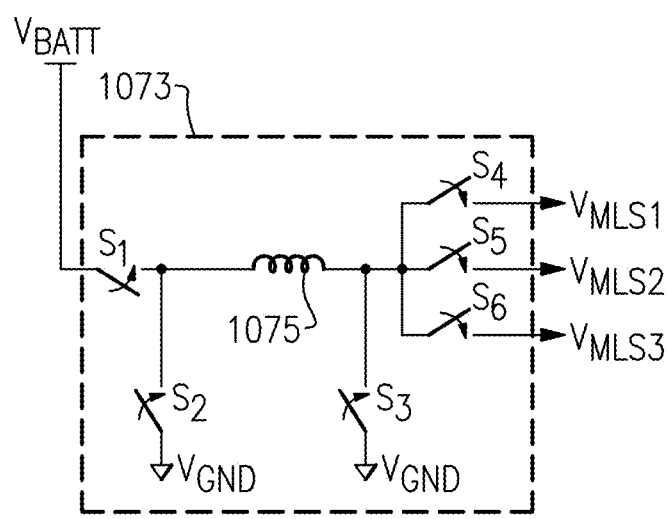
FIG. 10 is a schematic diagram of an MLS DC-to-DC converter according to one embodiment.

FIG. 10 is a schematic diagram of an MLS DC-to-DC converter 1073 according to one embodiment. The MLS DC-to-DC converter 1073 includes an inductor 1075, a first switch $S_1$, a second switch $S_2$, a third switch $S_3$, a fourth switch $S_4$, a fifth switch $S_5$, and a sixth switch $S_6$. The MLS DC-to-DC converter 1073 further includes control circuitry (not shown in FIG. 10) for opening and closing the switches to provide regulation.

The MLS DC-to-DC converter 1073 of FIG. 10 illustrates one implementation of an MLS DC-to-DC converter suitable for incorporation in a multi-level envelope tracker. However, other implementations of MLS DC-to-DC converters can be included in multi-level envelope trackers implemented in accordance with the teachings herein.

In the illustrated embodiment, the first switch $S_1$ includes a first end electrically connected to the battery voltage $V_{BATT}$ and a second end electrically connected to a first end of the second switch $S_2$ and to a first end of the inductor 1075. The second switch $S_2$ further includes a second end electrically connected to a first or ground supply $V_{GND}$. Although FIG. 10 illustrates a configuration of a DC-to-DC converter that is powered using a ground supply and a battery voltage, the teachings herein are applicable to DC-to-DC converters powered using any suitable power supplies. The inductor 1075 further includes a second end electrically connected to a first end of each of the third to sixth switches $S_3$-$S_6$. The third switch $S_3$ further includes a second end electrically connected to the ground supply $V_{GND}$. The fourth, fifth, and sixth switches $S_4$-$S_6$ each include a second end configured to generate the first, second, and third regulated voltages $V_{MLS1}$, $V_{MLS2}$, and $V_{MLS3}$, respectively.

The first to sixth switches $S_1$-$S_6$ are selectively opened or closed to maintain regulated voltages within a particular error tolerance of target voltage levels. Although an example with three regulated voltages is shown, the MLS DC-to-DC converter 1073 can be implemented to generate more or fewer regulated voltages.

In the illustrated embodiment, the MLS DC-to-DC converter 1073 operates as a buck-boost converter operable to generate regulated boost voltages greater than the battery voltage $V_{BATT}$ and/or regulated buck voltages lower than the battery voltage $V_{BATT}$. However, other implementations are possible.

Figure 11:
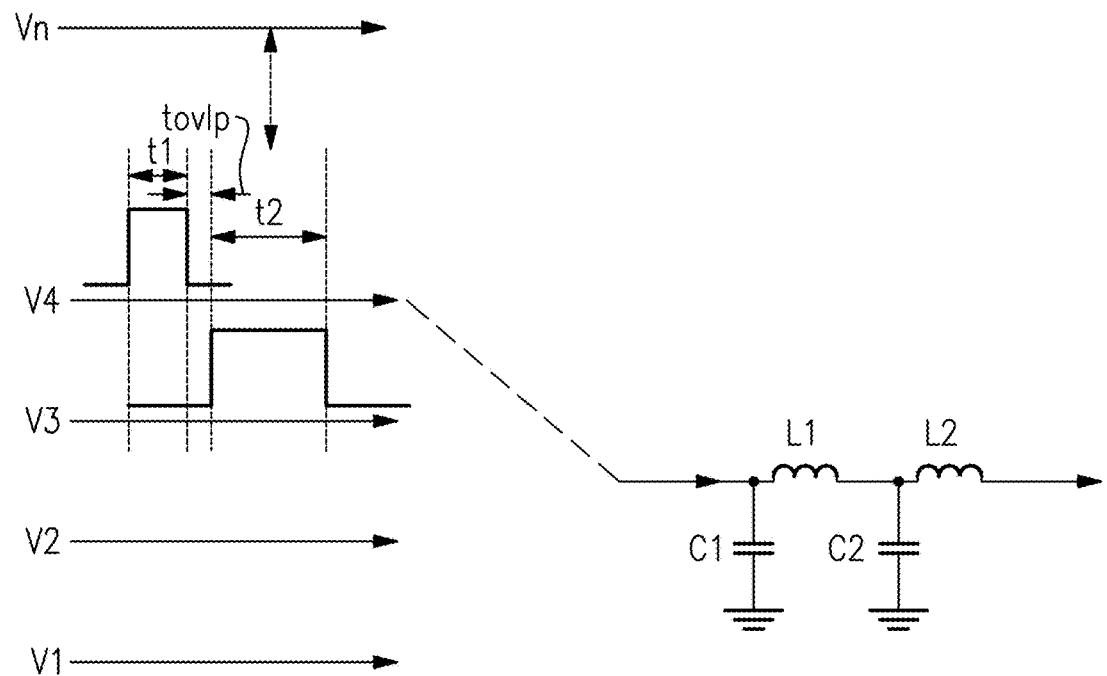
FIG. 11 is a schematic diagram of one example of timing for MLS DC-to-DC conversion.

FIG. 11 is a schematic diagram of one example of timing for MLS DC-to-DC conversion. As shown in FIG. 11, the width of regulation cycles can be used to control the voltage level of the regulated voltages generated by MLS DC-to-DC conversion. For instance, one MLS regulated voltage can be associated with a period t1, while a second regulation voltage can be associated with a different period t2. Additionally, a non-overlap period tovlp can be used to avoid crowbar currents between different voltage levels.

In certain implementations herein, one or more regulation periods (for instance, t1 and/or t2) and/or one or more non-overlap period (for instance, tovlop) are digitally controllable. In certain implementations, the delays are controlled based on a digital state machine and/or other suitable circuitry.

The regulated voltages generated by MLS DC-to-DC conversion can be selectively provided by a modulator to a modulator output filter. In the illustrated example, the modulator output filter is depicted as including shunt capacitors C1 and C2 and series inductors L1 and L2. However, other implementations of modulator output filters are possible.

Providing both an AC path through a modulator output filter and a separate DC path that bypasses the modulator provides enhanced efficiency. For instance, by implementing the envelope tracking system in this manner, the energy accumulated in the inductors of the modulator's output filter (for instance, inductors L1 and/or L2) can be reduced. This reduced energy in turn decreases overshoot into the filter and/or back-crowbar current into the MLS switches.

In one embodiment, an MLS DC-to-DC converter generates two or more MLS voltages for a modulator that controls a power amplifier supply voltage, and a DC voltage that controls the power amplifier supply voltage through a DC path that bypasses the modulator. Additionally, the regulation of the DC voltage is different from the regulation of the MLS voltages. For example, the regulation period and/or non-overlap period used for regulation can be different for the DC voltage relative to the MLS voltages. Thus, pulse-width modulator (PWM) sequence can be different for the DC path versus the AC path.

Figure 12:
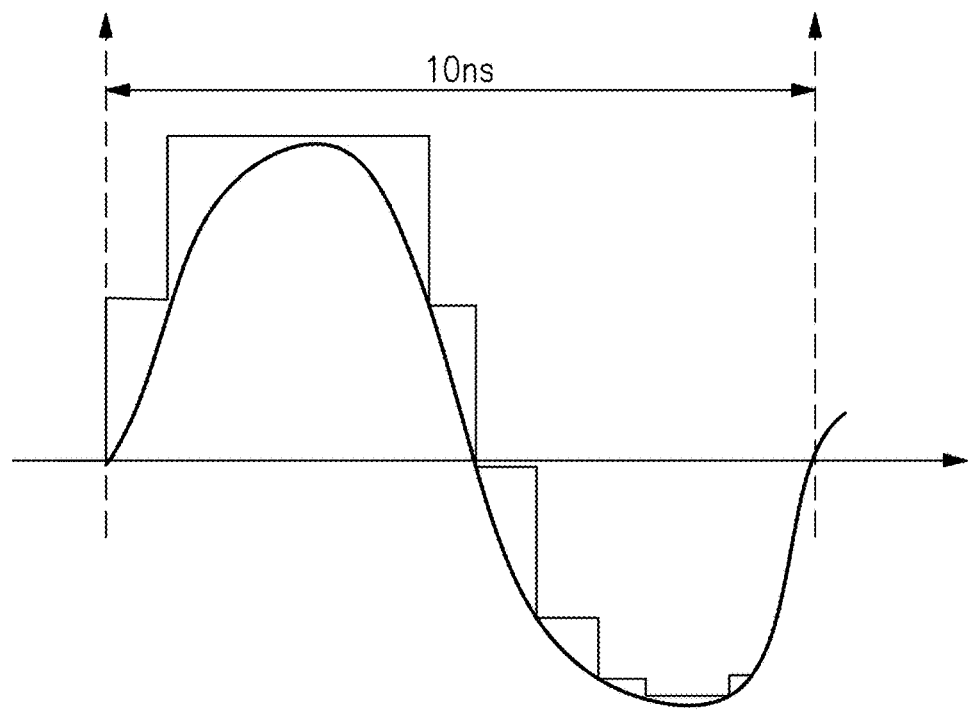
FIG. 12 is a schematic diagram of one example of MLS envelope tracking for a continuous wave signal.

FIG. 12 is a schematic diagram of one example of MLS envelope tracking for a continuous wave signal. The example shown is for a continuous wave signal having a frequency of about 100 MHz and a corresponding period of about 10 ns. Examples of suitable MLS voltage levels for the signal are shown.

Figure 13:
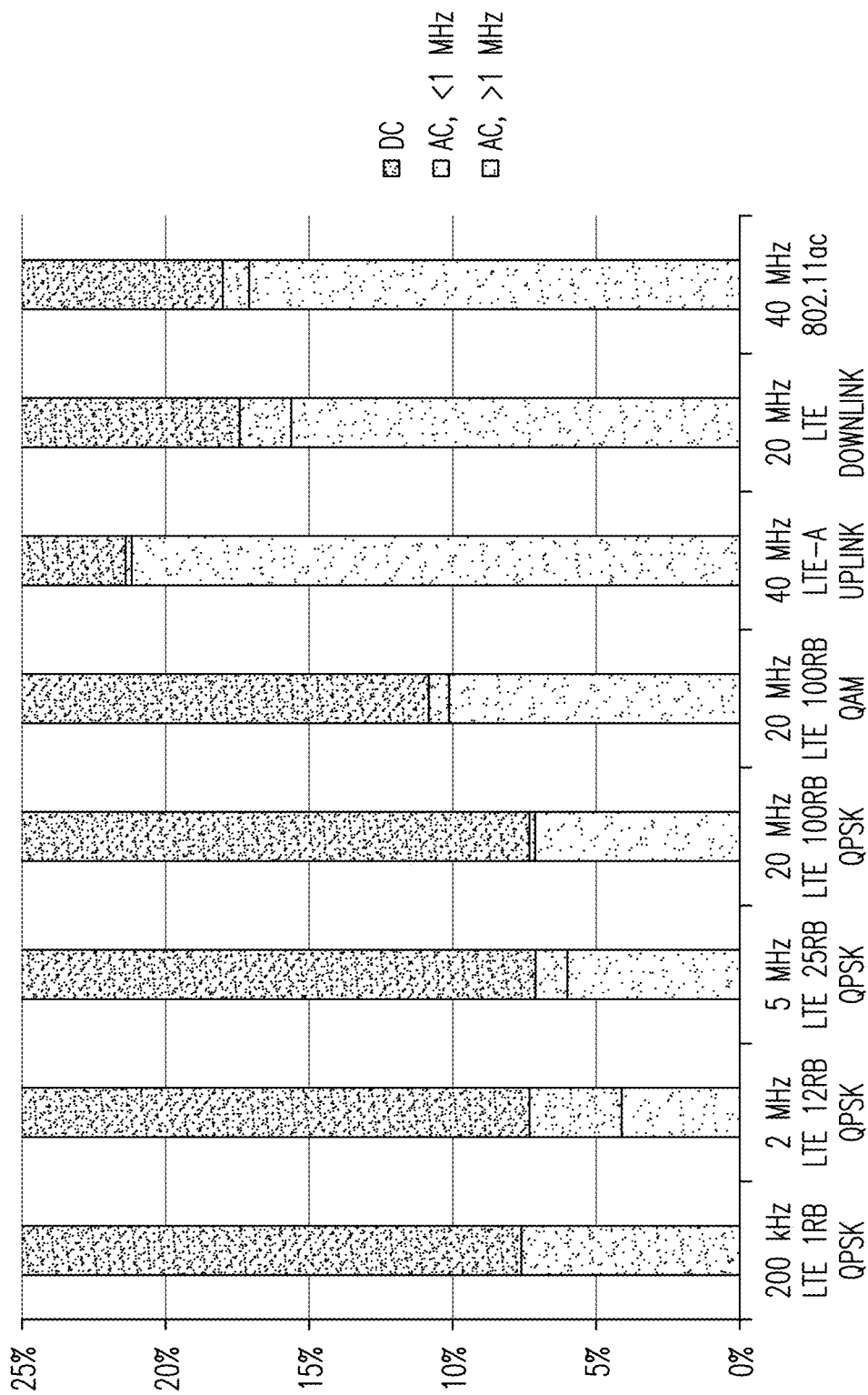
FIG. 13 is a schematic diagram of one example of envelope frequency distribution for various signal waveforms.

FIG. 13 is a schematic diagram of one example of envelope frequency distribution for various signal waveforms. For each type of signal waveform, the graph depicts the percentage of DC envelope energy, AC envelope energy less than 1 MHz, and AC envelope energy greater than 1 MHz. Providing both an AC path through a modulator output filter and a separate DC path that bypasses the modulator provides enhanced efficiency for a variety of types of RF signal waveforms.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracking system comprising:
    a power amplifier configured to amplify a radio frequency signal and to receive power from a power amplifier supply voltage;
    a controllable delay circuit configured to generate a plurality of delay-controlled regulated voltages based on controlling a delay of a plurality of regulated voltages;
    a modulator including a modulator output configured to generate a modulator output voltage, a plurality of switches each coupled between the modulator output and a corresponding one of the plurality of delay-controlled regulated voltages, and a modulator control circuit configured to control activation of the plurality of switches based on an envelope of the radio frequency signal; and
    a first filter coupled between the modulator output and the power amplifier supply voltage.

2. The envelope tracking system of claim 1 further comprising a second filter coupled between a DC voltage and the power amplifier supply voltage.

3. The envelope tracking system of claim 2 wherein the controllable delay circuit is operable to control a relative delay between an AC path through the first filter and a DC path through the second filter.

4. The envelope tracking system of claim 2 further comprising a DC-to-DC converter configured to generate the DC voltage and the plurality of regulated voltages.

5. The envelope tracking system of claim 2 wherein the second filter includes at least one series inductor and at least one shunt capacitor.

6. The envelope tracking system of claim 1 wherein each of the plurality of regulated voltages has a different voltage level.

7. The envelope tracking system of claim 1 wherein the first filter includes at least one series inductor and at least one shunt capacitor.

8. The envelope tracking system of claim 1 wherein the first filter further includes a DC blocking capacitor in series between the modulator output voltage and the power amplifier supply voltage.

9. The envelope tracking system of claim 1 wherein the controllable delay circuit includes a plurality of controllable delay buffers each configured to control a delay of a respective one of the plurality of regulated voltages.

10. The envelope tracking system of claim 1 further comprising a DC-to-DC converter configured to generate the plurality of regulated voltages.

11. A mobile device comprising:
a transceiver configured to generate a radio frequency signal;
a front end circuit including a power amplifier configured to amplify the radio frequency signal and to receive power from a power amplifier supply voltage; and
a power management circuit including a controllable delay circuit configured to generate a plurality of delay-controlled regulated voltages based on controlling a delay of a plurality of regulated voltages, a modulator including a modulator output configured to generate a modulator output voltage, and a first filter coupled between the modulator output and the power amplifier supply voltage, the modulator further including a plurality of switches each coupled between the modulator output and a corresponding one of the plurality of delay-controlled regulated voltages and a modulator control circuit configured to control activation of the plurality of switches based on an envelope of the radio frequency signal.

12. The mobile device of claim 11 wherein the power management circuit further includes a second filter coupled between a DC voltage and the power amplifier supply voltage.

13. The mobile device of claim 12 wherein the controllable delay circuit is operable to control a relative delay between an AC path through the first filter and a DC path through the second filter.

14. The mobile device of claim 12 wherein the second filter includes at least one series inductor and at least one shunt capacitor.

15. The mobile device of claim 11 wherein each of the plurality of regulated voltages has a different voltage level.

16. The mobile device of claim 11 wherein the first filter includes at least one series inductor and at least one shunt capacitor.

17. The mobile device of claim 11 wherein the first filter further includes a DC blocking capacitor in series between the modulator output voltage and the power amplifier supply voltage.

18. The mobile device of claim 11 wherein the controllable delay circuit includes a plurality of controllable delay buffers each configured to control a delay of a respective one of the plurality of regulated voltages.

19. The mobile device of claim 11 wherein the power management circuit further includes a DC-to-DC converter configured to generate the plurality of regulated voltages.

20. A method of envelope tracking, the method comprising:
amplifying a radio frequency signal using a power amplifier;
supplying power to the power amplifier using a power amplifier supply voltage;
generating a plurality of delay-controlled regulated voltages based on controlling a delay of a plurality of regulated voltages using a controllable delay circuit;
generating a modulator output voltage at a modulator output of a modulator;
providing filtering using a first filter coupled between the modulator output and the power amplifier supply voltage; and
controlling activation of a plurality of switches of the modulator based on an envelope of the radio frequency signal, the plurality of switches each coupled between the modulator output and a corresponding one of the plurality of delay-controlled regulated voltages.

* * * * *